(12) United States Patent
Standing et al.

(10) Patent No.: US 7,968,984 B2
(45) Date of Patent: Jun. 28, 2011

(54) UNIVERSAL PAD ARRANGEMENT FOR SURFACE MOUNTED SEMICONDUCTOR DEVICES

(75) Inventors: Martin Standing, Kent (GB); Andrew Neil Sawle, West Sussex (GB)

(73) Assignee: International Rectifier Corporation, El Segundo, CA (US)

( * ) Notice: Subject to any disclaimer, the term of this patent is extended or adjusted under 35 U.S.C. 154(b) by 244 days.

(21) Appl. No.: 11/551,767

(22) Filed: Oct. 23, 2006

(65) Prior Publication Data

US 2007/0091546 A1    Apr. 26, 2007

Related U.S. Application Data

(60) Provisional application No. 60/729,985, filed on Oct. 25, 2005.

(51) Int. Cl.
*H01L 23/02* (2006.01)
*H01L 23/58* (2006.01)

(52) U.S. Cl. . 257/678; 257/691; 257/723; 257/E23.001; 257/E23.194

(58) Field of Classification Search .......... 257/678–733, 257/787–796, E23.001–23.194
See application file for complete search history.

(56) References Cited

U.S. PATENT DOCUMENTS

| 4,489,365 | A | 12/1984 | Daberkoe |
| 6,624,522 | B2 * | 9/2003 | Standing et al. ............... 257/782 |
| 2001/0048116 | A1 | 12/2001 | Standing |
| 2005/0087847 | A1 | 4/2005 | Kuan et al. |

FOREIGN PATENT DOCUMENTS

TW    503487 B    9/2002

OTHER PUBLICATIONS

International Search Report dated Nov. 28, 2007 issued in the corresponding PCT Application No. PCT/US06/41813.

* cited by examiner

*Primary Examiner* — N Drew Richards
*Assistant Examiner* — Mamadou Diallo
(74) *Attorney, Agent, or Firm* — Farjami & Farjami LLP

(57) ABSTRACT

An apparatus for coupling a plurality of surface mounted semiconductor device packages to a circuit board is provided. Each package including a semiconductor device die and a metal clip including a flat web portion having a bottom surface and at least one peripheral rim portion extending from an edge of said flat web portion, said bottom surface having solderable planar metal electrodes or pads on its bottom surface, the contact pads being formed in plurality of layouts having one or more columns and one or more rows. The apparatus including a circuit board contact pattern including one or more columns and one or more rows of contacts, a number of rows being equal to a largest number of contact pad rows in the plurality of contact pad layouts, a number of columns being equal to a largest number of contact pad columns in the plurality of contact pad layouts. The circuit board contact pattern is usable by all of the plurality of the contact pad layouts of the plurality of semiconductor device packages.

14 Claims, 5 Drawing Sheets

UNIVERSAL PAD ARRANGEMENT FOR SURFACE MOUNTED SEMICONDUCTOR DEVICES

CROSS-REFERENCE TO RELATED APPLICATION

The present application is based on and claims priority to U.S. Provisional Patent Application Ser. No. 60/729,985, filed on Oct. 25, 2005 and entitled UNIVERSAL PAD ARRANGEMENT FOR SURFACE MOUNTED SEMICONDUCTOR DEVICES, the entire contents of which is hereby incorporated by reference.

BACKGROUND OF THE INVENTION

This invention relates to a semiconductor device mounting and more specifically to a universally usable contact pattern for surface mounted semiconductor device die.

Semiconductor device die, such as flip chip surface mounted die and International Rectifier's DirectFET® packages described, for example in U.S. Pat. No. 6,624,522, carry die which have a particular planar contact pattern. Thus for MOSFET die, planar source, gate and drain contacts are presented, which must align to the respective contacts of an end user's or customer's circuit board. Other die will include diodes, IGBTs, and the like. The contact pattern on the die will differ in shape and number, depending on die size and current and voltage ratings.

The DirectFET package is a surface-mount package that improves MOSFET performance by lowering both the package's electrical and thermal resistance. The DirectFET package does so with a design that permits direct attachment of the die to a circuit board via solderable pads on the chip or die and through attachment to the interior of a copper or other conductive material drain clip that allows double-sided cooling. The die in the DirectFET package is a passivated die attached to a copper clip. Solderable metal contacts on the bottom of the die provide contacts such as gate and source contacts for a MOSFET to be mounted on and connected to a circuit board, while the copper clip provides an electrical connection to the MOSFET drain and permits topside cooling.

The circuit board pattern of contact locations is designed by each end user/customer to meet the contact pattern of the particular package. Thus, the circuit board will be designed with 2, 3, 4, 5, or any other number of spaced contacts of selected areas in some particular rectangular-like or mesh-like pattern.

The end user must then produce support board with surface contact patterns which match the number and pattern of the device to be mounted. Differences in the patterns and contact numbers increase the end-user's manufacturing process.

SUMMARY OF THE INVENTION

It is an object of the present invention to provide a universally usable contact pattern for surface mounted semiconductor device die.

In accordance with the invention, the contact pattern or mesh pattern of a circuit board is designed to match two or more possible patterns of solderable contact pads on a die that may be selected for use with the circuit board by the end user. The die solderable contact pads which are in unselected positions and will not be used by the end user can be insulated by a solder mask during a fabrication process of the die. Alternatively, unused contacts of the circuit board's contact pattern can be insulated.

An apparatus for coupling a plurality of surface mounted semiconductor device packages to a circuit board is provided. Each package including a semiconductor device die and a metal clip including a flat web portion having a bottom surface and at least one peripheral rim portion extending from an edge of said flat web portion, said bottom surface being electrically connected to a solderable planar metal electrode on a bottom surface of said die via contact pads, the contact pads being formed in plurality of layouts having one or more columns and one or more rows. The apparatus including a circuit board contact pattern including one or more columns and one or more rows of contacts, a number of rows being equal to a largest number of contact pad rows in the plurality of contact pad layouts, a number of columns being equal to a largest number of contact pad columns in the plurality of contact pad layouts. The circuit board contact pattern is usable by all of the plurality of the contact pad layouts of the plurality of semiconductor device packages.

Other features and advantages of the present invention will become apparent from the following description of the invention that refers to the accompanying drawings.

DETAILED DESCRIPTION OF EMBODIMENTS OF THE INVENTION

The present invention provides a novel universally usable contact pattern for use with surface mounted semiconductor device die of a kind having power or other electrodes available for surface mounting on a common support surface, i.e., the moralized pattern on a printed circuit board.

Figure 1:
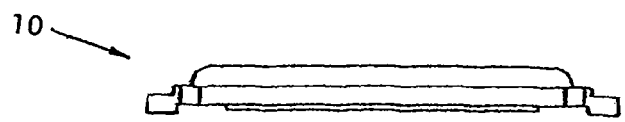
FIG. 1 is a side view of a DirectFET® package.

FIG. 1 illustrates a side view of a surface mounted semiconductor DirectFET package 10 that is coupled to a surface of a circuit board (not shown). Solderable contact pads of a semiconductor die are disposed on the bottom surface of the package 10. Some of the various layout types of the solderable contact pads will be illustrated below with reference to FIGS. 2-4. Prior to the present invention, each package within the layout type required a unique circuit board contact pattern to accommodate unique contact pad layouts of the packages. A circuit board universal contact pattern, explained with reference to FIGS. 5a and 5b eliminates this requirement.

Figure 2A:
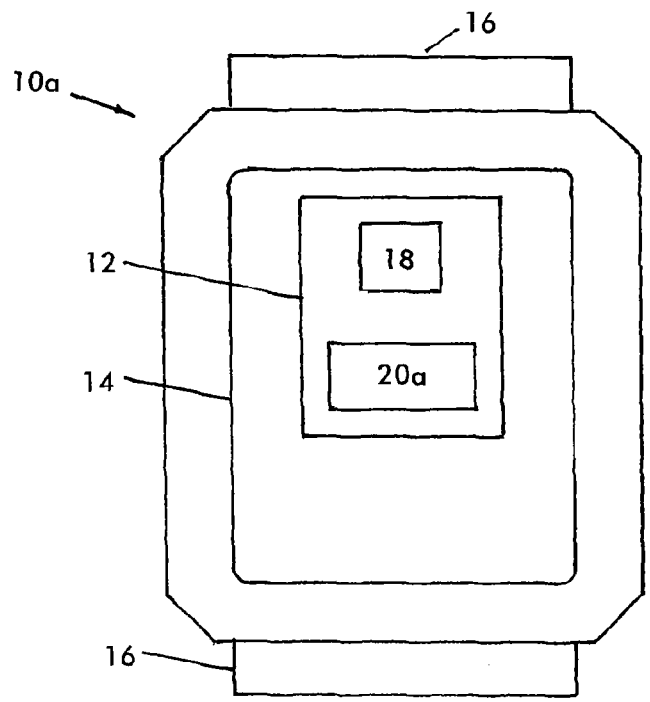
FIGS. 2a-2b are bottom views of surface mounted packages with a first layout, using one column and one or more rows, of contact pads.
Figure 2B:
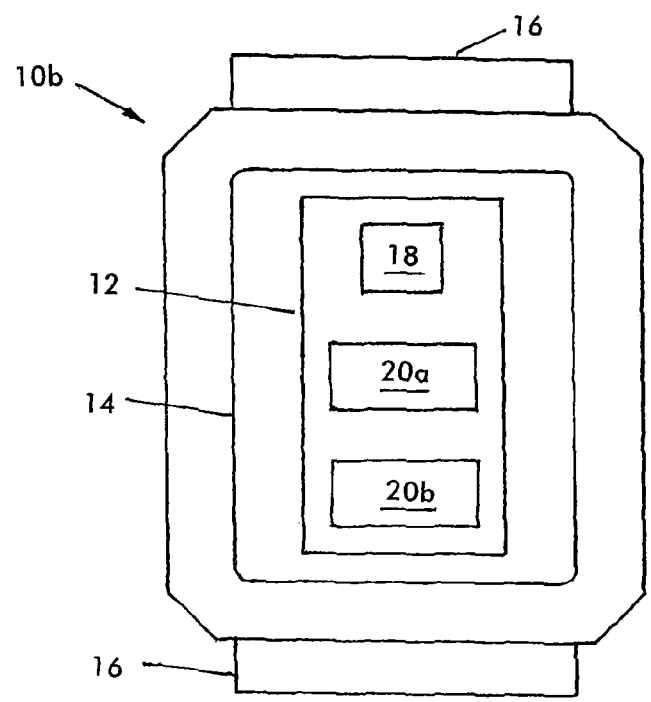

FIGS. 2a and 2b illustrate a bottom view of the surface mounted package having a first layout type of the solderable contact pads. The first layout type uses one column and one or more rows of contact pads. FIG. 2a shows a package 10a comprising a die 12 and a metal clip. The metal clip including a flat web portion 14 having a bottom surface and at least one peripheral rim portion 16 extending from an edge of said flat web portion and being electrically connected to a solderable planar metal electrode on a top surface of the die 12. The peripheral rim portion 16 forming one of the contacts, e.g., a MOSFET drain contact with the circuit board. The bottom surface of die 12 has a solderable planar metal electrodes or pads including source contact pads 18 and a gate contact 20*a*. FIG. 2*b* shows a package 10*b* that is similar to the package 10*a* of FIG. 2*a*. In addition to the contact pad 20*a* the package 10*b* further includes a second source contact 20*b* in the second row of contact pads.

Figure 3A:
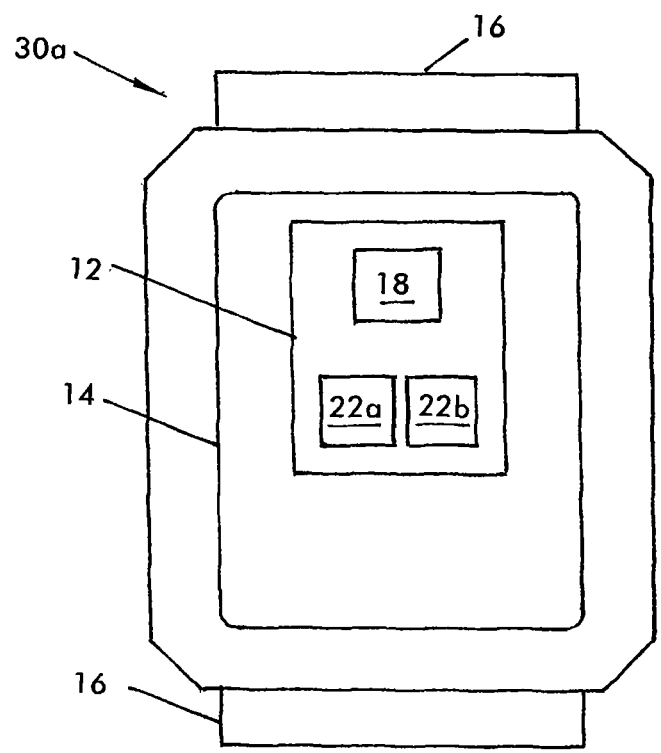
FIGS. 3a-3b are bottom views of surface mounted packages with a second layout, using two column and one or more rows, of contact pads.
Figure 3B:
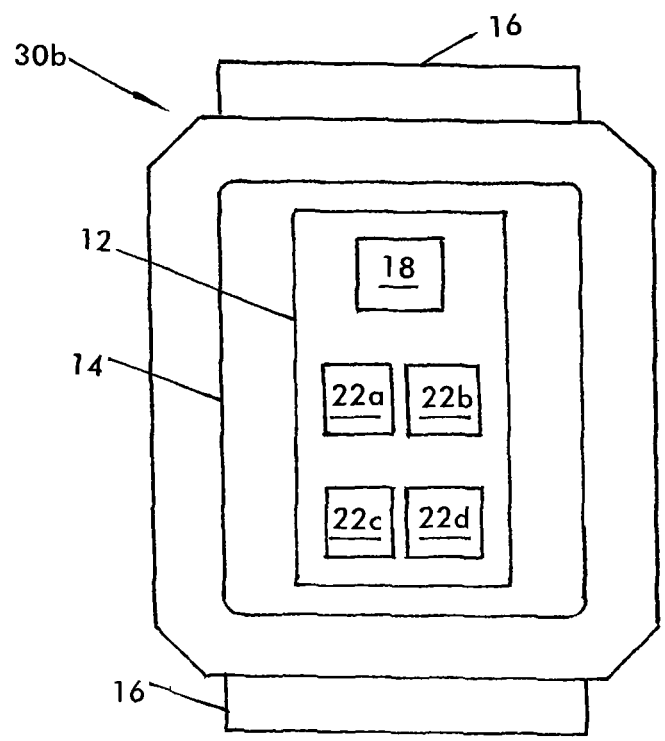

FIGS. 3*a* and 3*b* illustrate a bottom view of the surface mounted package 30 including a second layout type of the solderable contact pads. The second layout type uses two columns and one or two rows of contact pads. FIG. 3*a* shows a package 30*a* comprising the die 12 and the metal clip. The metal clip includes the flat web portion 14 having a bottom surface and at least one peripheral rim portion 16 extending from an edge of said flat web portion 14 and being electrically connected to a solderable planar metal electrode on a top surface of the die 12. The peripheral rim portion 16 forming one of the contacts, e.g., a MOSFET drain contact, with the circuit board. The bottom surface carries a solderable planar metal electrode consisting of gate contact pad 18 and source electrodes or pads 22*a*-22*b*. FIG. 3*b* shows a package 30*b* that is similar to the package 30*a* of FIG. 3*a*. In addition to the contact pads 22*a* and 22*b* the package 30*b* further includes source contact pads 22*c*-22*d* in the second row of contact pads.

Figure 4A:
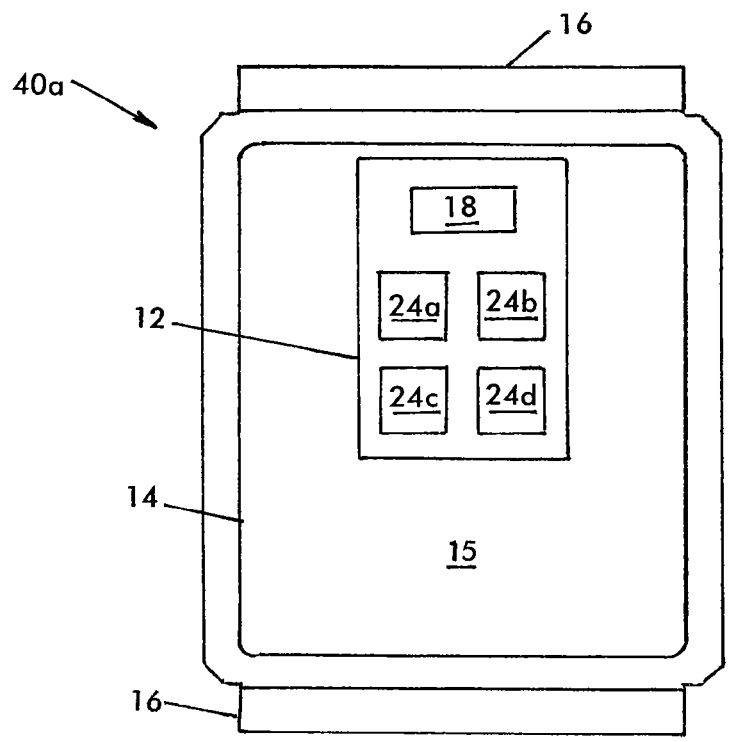
FIGS. 4a-4d are bottom views of surface mounted packages with a third contact layout, using two or more columns and two or more rows, of contact pads.
Figure 4B:
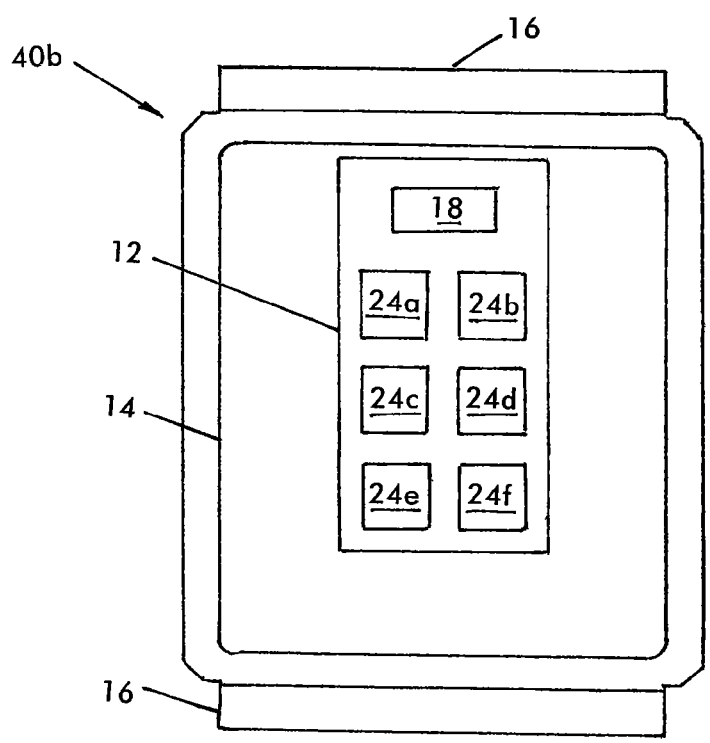
Figure 4C:
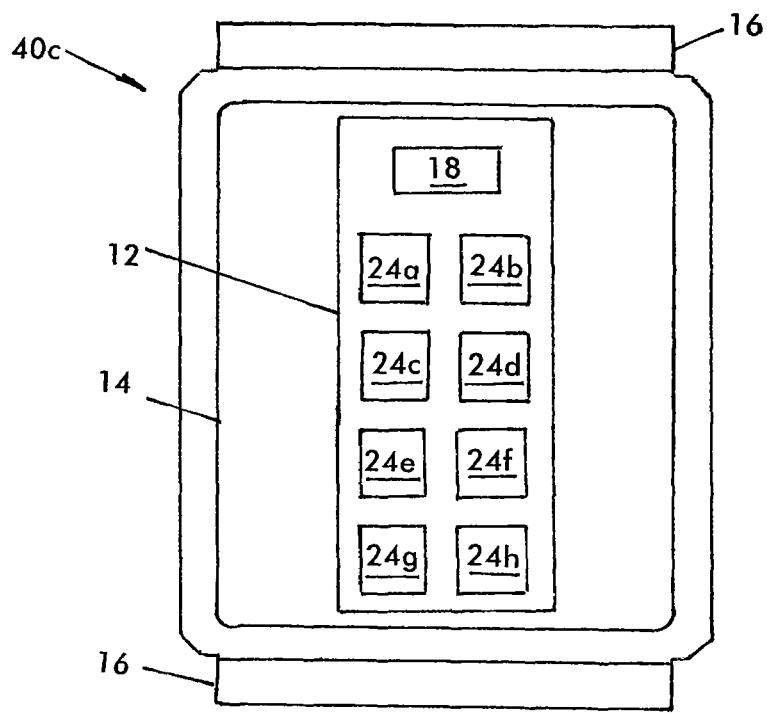

FIGS. 4*a*-4*b* illustrate a bottom view of the surface mounted package 40 including a third layout type of the solderable contact pads. The third layout type uses two to four columns and two to four rows of electrodes or contact pads. FIG. 4*a* shows a package 40*a* comprising the die 12 and the metal clip. The metal clip including the flat web portion 14 having a bottom surface has at least one peripheral rim portion 16 extending from an edge of said flat web portion 14 which is electrically connected to a solderable planar drain metal electrode on a top surface of the die 12. The peripheral rim portion 16 forms one of the contacts, e.g., a MOSFET drain contact with the circuit board. The bottom surface contains solderable planar metal electrodes on the bottom surface of the die 12 via gate contact pad 18, and source electrodes 24*a*-24*d*. The layout type of the package 40*a* is different from that of the package 30*b* of FIG. 3*b* in that it provides additional space 15 for inclusion of additional contact pads as will be shown with reference to FIGS. 4*b* and 4*d*.

FIG. 4*b* shows the package 40*b* that is similar to the package 40*a* of FIG. 4*a*. In addition to the contact pads 24*a* and 24*b* the package 40*b* further includes contact pads 24*e*-24*e* in the third row of source contact pads. The package 40*c* of FIG. 4*c* includes two more rows of contact pads 24*e*-24*h*. Additionally, the package 40*d* of FIG. 4*d* includes two rows and two columns of additional contact pads 24*e*-24*p* over the package 40*a* of FIG. 4*a*.

It should be understood that the above-described and illustrated contact pad layout types as used as an example and are not intended to limit the scope of the present invention. The present invention can easily accommodate any number of additional contact pad layout types.

As stated above, prior to the present invention each surface mounted semiconductor device package required a unique circuit board contact pattern to accommodate unique contact pad layouts. That required provision of unique circuit boards for each circuit design using different semiconductor device packages. In accordance with the present invention the universal contact pattern will accommodate the contact pad layouts of all packages using the same circuit board contact pattern.

Figure 5A:
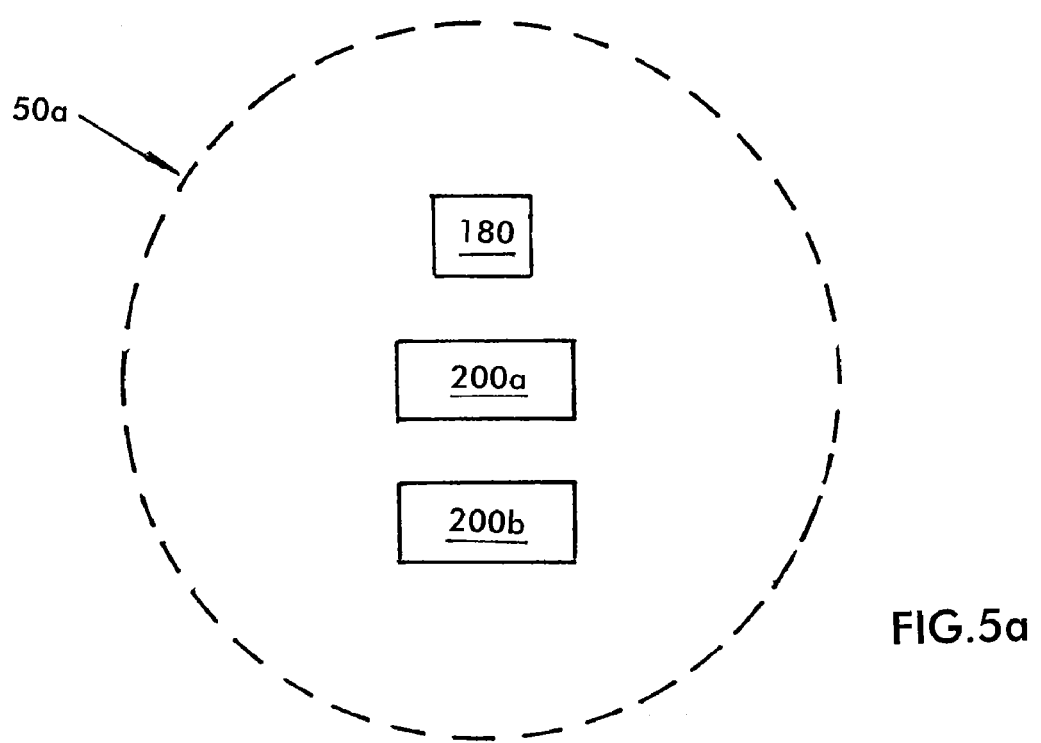
FIGS. 5a-5b are a partial diagram of a circuit board contact pattern of the present invention for coupling surface mounted packages having contact layouts that include one or more columns and one or more rows of contact pads.

In accordance with the present invention the many different layouts of the solderable contact pads of the surface mounted semiconductor device packages may be accommodated by a universally usable contact pattern of a circuit board for surface mounted semiconductor device packages. Accordingly, FIG. 5*a* illustrates a contact pattern usable by packages having the layout type of the first type, as illustrated in FIGS. 2*a* and 2*b*. The contact pattern 50*a* includes a contact 180, e.g., a gate contact, and source contacts 200*a* and 200*b*. This contact pattern 50*a* accommodates both packages 10*a* and 10*b* of FIGS. 2*a* and 2*b* respectively.

Figure 4D:
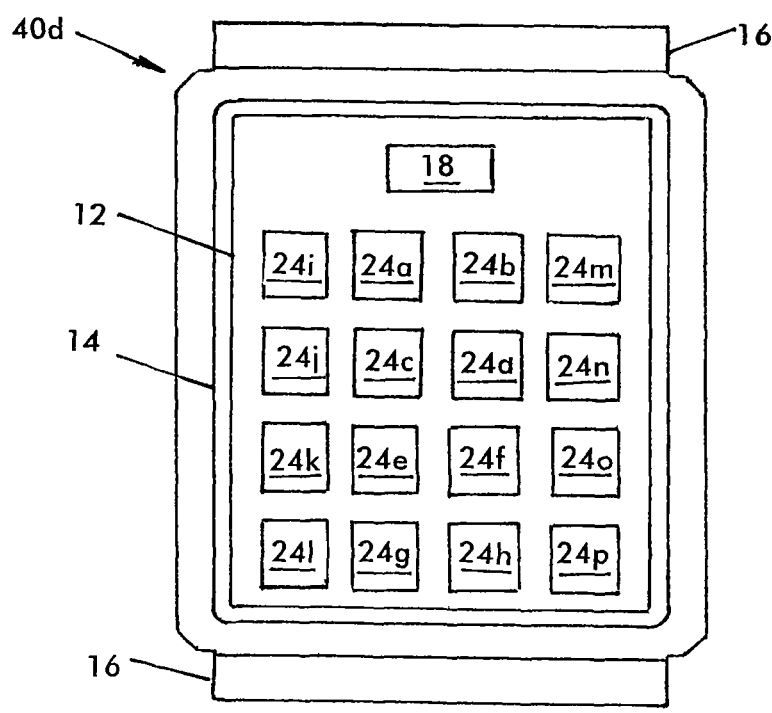
Figure 5B:
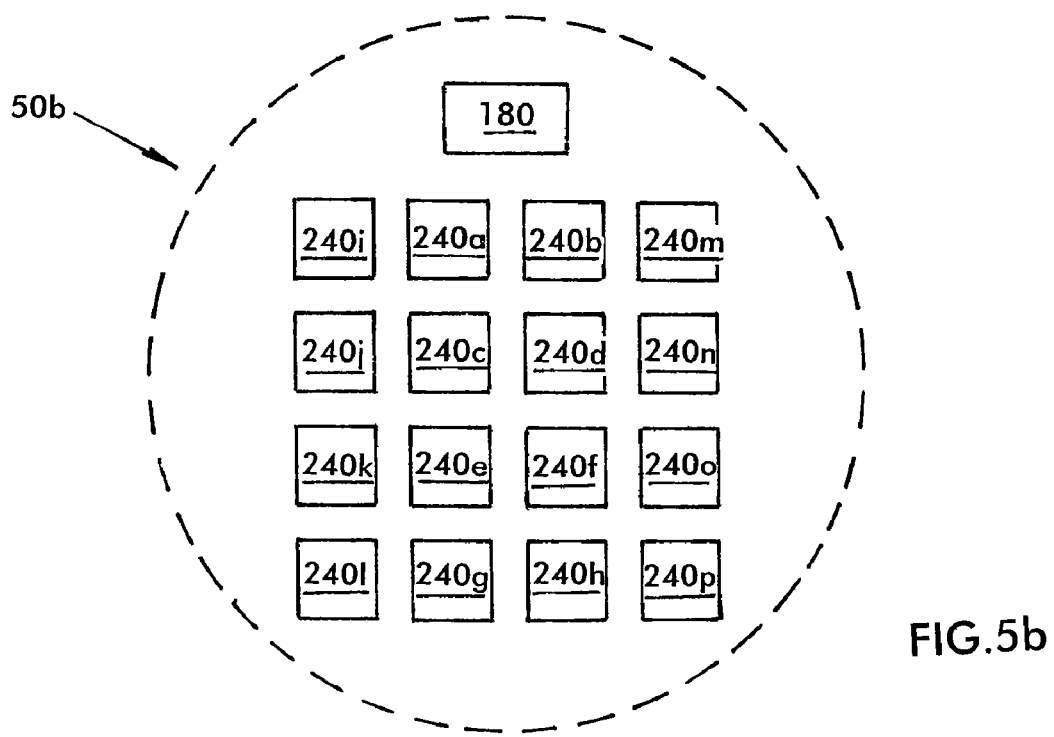

Similarly, FIG. 5*b* illustrates a circuit board contact pattern usable for packages having the layout type of the third type, as illustrated in FIGS. 4*a* and 4*d*. The contact pattern 50*b* includes a contact 180, e.g., a gate contact, and contacts 240*a*-240*p*. This contact pattern 50*b* accommodates packages 40*a*-40*d* of FIGS. 4*a*-2*d* respectively.

The circuit board contact pattern of the present invention enables the end-users to design and modify circuits to use packages having various layouts of surface contacts without having to redesign the circuit board. The contact pattern of the circuit board will accommodate the surface mounted packages without having to match the exact number and pattern of the packages' contact pads.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A circuit board capable of receiving one of a plurality of surface mounted semiconductor device packages, each package including a semiconductor device die and a metal clip including a flat web portion having a bottom surface and at least one peripheral rim portion extending from an edge of said flat web portion, said semiconductor device die including spaced solderable planar metal pads on a bottom surface thereof, the pads including at least one gate pad and a plurality of source pads, wherein each said semiconductor device die includes a different number of source pads, and wherein one of said semiconductor device die includes source pads greater in number than source pads of other semiconductor device die in said plurality of surface mounted semiconductor device packages, the circuit board comprising:

a circuit board contact pattern including one or more columns of source contacts for connection to source pads of a respective semiconductor device die and at least one gate contact for connection to a gate pad of said semiconductor device die, wherein said source contacts are greater in number than said source pads of said one of said semiconductor device die, and wherein said circuit board contact pattern is usable by all of said pads of said semiconductor device die of said plurality of semiconductor device packages.

2. The circuit board of claim 1, wherein said source pads are arranged in rows and columns.

3. The circuit board of claim 2, wherein the number of rows is in a range from one to four.

4. The circuit board of claim 2, wherein the number of columns is in a range from one to four.

5. A circuit board for receiving a semiconductor package that includes a conductive clip having a web portion, and a semiconductor die having a drain electrode thereof connected to said web portion and a plurality of source contact pads and a gate contact pad, the circuit board comprising:

a gate contact for electrical connection to said gate contact pad; and a plurality of source contacts arranged in rows and columns, wherein a number of said source contact pads of said semiconductor die is less than a number of said source contacts.

6. The circuit board of claim 1, wherein each row include a same number of source contacts.

7. The circuit board of claim 1, wherein each column includes a same number of source contacts.

8. The circuit board of claim 1, wherein each row and each column includes a same number of source contacts.

9. A method of accommodating a circuit board contact pattern comprising a plurality of substantially coplanar contacts capable of receiving a first semiconductor package and a second semiconductor package, each semiconductor package having a semiconductor device die with a plurality of contact pads disposed on a bottom surface of said semiconductor device die and a metal clip including a flat web portion having a bottom surface electrically connected to a solderable planar metal electrode on a top surface of said semiconductor device die and at least one peripheral rim portion electrically connected to and extending from an edge of said flat web portion, wherein said plurality of contact pads of said first semiconductor package are greater in number than said plurality of contact pads of said second semiconductor package, the method comprising:

insulating unused contacts of the plurality of substantially coplanar contacts based on a usage of the plurality of contact pads of the second semiconductor device; and coupling said plurality of substantially coplanar contacts with said plurality of contact pads and said at least one peripheral rim portion of said second semiconductor package.

10. The method of claim 9, wherein said plurality of substantially coplanar contacts, excluding any contacts receiving said at least one peripheral rim portion of said first or second semiconductor package, are arranged in rows and columns.

11. The method of claim 10, wherein the number of rows is in a range from one to four.

12. The method of claim 10, wherein the number of columns is in a range from one to four.

13. The method of claim 10, wherein each row includes a same number of contacts.

14. The method of claim 10, wherein each column includes a same number of contacts.

* * * * *